United States Patent [19]

Pilarcik, Jr.

[11] Patent Number: 4,581,725
[45] Date of Patent: Apr. 8, 1986

[54] METHOD AND SYSTEM FOR GAIN SELECTION

[75] Inventor: Andrew J. Pilarcik, Jr., Hurst, Tex.

[73] Assignee: Mobil Oil Corporation, New York, N.Y.

[21] Appl. No.: 400,522

[22] Filed: Jul. 21, 1982

[51] Int. Cl.$^4$ .............................................. H04B 3/04
[52] U.S. Cl. ..................................... 367/66; 307/493; 307/352; 375/76; 367/65
[58] Field of Search ............... 307/264, 356, 358, 352, 307/493; 330/254, 278, 129, 279; 340/858; 367/25, 26, 30, 65, 66, 67, 76, 78, 79; 375/25, 26, 76, 98

[56] References Cited

U.S. PATENT DOCUMENTS

| | | | |
|---|---|---|---|
| 3,289,157 | 11/1966 | Brokaw | 367/26 |
| 3,636,463 | 1/1972 | Ongkiehong | 330/278 |
| 3,828,262 | 8/1974 | Trocquemé | 367/66 |
| 3,919,685 | 11/1975 | Haill | 367/65 |
| 3,924,260 | 12/1975 | Braham et al. | 367/67 |
| 3,958,213 | 5/1976 | Scott et al. | 367/67 |
| 4,361,815 | 11/1982 | Schade, Jr. | 330/254 |
| 4,425,571 | 1/1984 | Muellner et al. | 346/136 |
| 4,426,651 | 1/1984 | Muellner et al. | 346/136 |
| 4,430,657 | 2/1984 | Scott et al. | 346/32 |
| 4,451,797 | 5/1984 | Bains, Jr. | 330/278 |
| 4,453,258 | 6/1984 | Richardson | 375/98 |
| 4,464,723 | 8/1984 | Chartier | 307/264 |
| 4,494,212 | 1/1985 | Muellner | 330/278 |

Primary Examiner—Salvatore Cangialosi
Assistant Examiner—Ian J. Lobo
Attorney, Agent, or Firm—A. J. McKillop; Michael G. Gilman; George W. Hager, Jr.

[57] ABSTRACT

An amplifier system repeatedly samples the voltage level of an analog signal and selects the gain to be applied to successive samplings of such signal in response to the voltage level of the sampled signals to thereby raise the amplitude of each sampled signal to a desired level.

4 Claims, 6 Drawing Figures

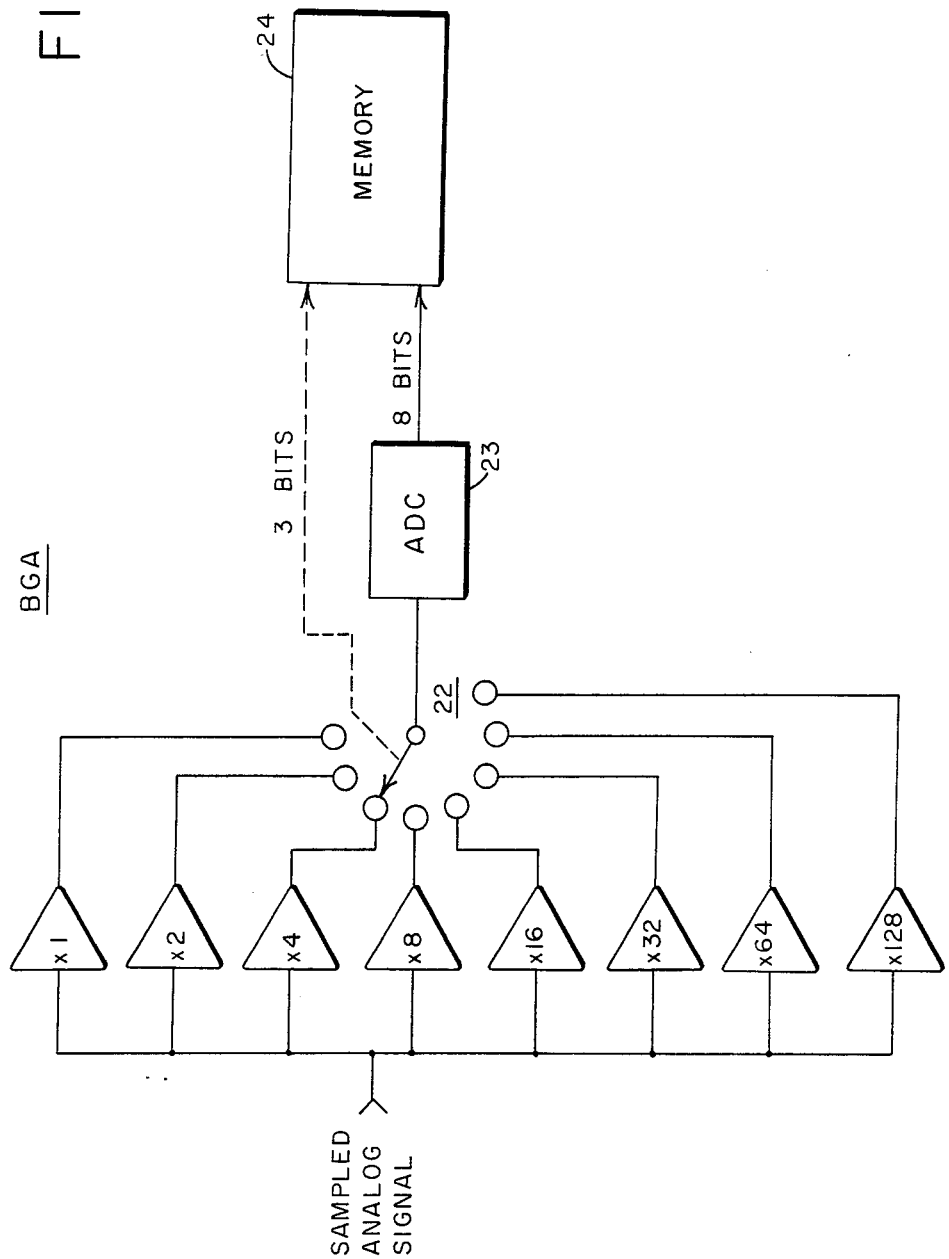

$T_d$ = CABLE DELAY
$T_a$ = ACQUISITION PERIOD
$T_t$ = TRANSMISSION PERIOD

FIG. 6

| VOLTAGE RANGE | GAIN |
|---|---|
| + 5.12V TO +10.24 V | 1 |
| + 2.56V TO +5.12 V | 2 |
| + 1.28V TO +2.56 V | 4 |
| +640 MV TO +1.28 V | 8 |
| +320 MV TO +640 MV | 16 |
| +160 MV TO +320 MV | 32 |
| + 80 MV TO +160 MV | 64 |
| 0 TO + 80 MV | 128 |
| 0 MV TO -80 MV | 128 |
| -80 MV TO -160 MV | 64 |
| -160 MV TO -320 MV | 32 |
| -320 MV TO -640 MV | 16 |
| -640 MV TO -1.28 V | 8 |
| -1.28V TO -2.56 V | 4 |
| -2.56V TO -5.12 V | 2 |
| -5.12 V TO -10.24 V | 1 |

METHOD AND SYSTEM FOR GAIN SELECTION

BACKGROUND OF THE INVENTION

This invention relates to a new and improved method and system for gain selection in the amplification of electrical signals.

In U.S. Pat. No. 3,302,166 to Joseph Zemanek, Jr., there is disclosed an acoustic velocity logging system wherein a downhole tool comprises a plurality of transducers including a transmitter and multiple receivers. The receivers are spaced at different distances from the transmitter such that an acoustic pulse from the transmitter arrives at the receivers by way of different travel paths through the formation surrounding the borehole. Upon generation of an acoustic pulse by the transmitter, a transmitter trigger pulse is transmitted uphole by way of a conductor in the logging cable. The analog signals produced by the receivers in response to the arrival of the acoustic pulse at the receivers are also transmitted uphole by way of conductors within the logging cable.

Receiver signals from borehole logging systems such as described in the aforementioned U.S. patent to Zemanek, Jr. have typically been amplified and transmitted over several miles of logging cable in analog form. In U.S. Pat. No. 3,518,679 to Baldwin and Glover, there is disclosed an acoustic velocity logging tool having an analog amplification system in which a downhole switching means is employed to change the gain of the downhole analog amplifier through which the receiver signals are passed to the logging cable. Such switching means employs a bank of resistors to which the receiver signals are applied. A rotary switch is controllable from uphole so as to select the output of one of the resistors in such bank for application to the input of the analog amplifier. In this manner, gain selection for the analog amplification system is controlled through attenuation of the receiver signals prior to amplification by the downhole analog amplifier. The amplified analog receiver signals are then transmitted uphole over the logging cable in real time.

SUMMARY OF THE INVENTION

In accordance with the present invention there is provided a method and system for selecting the gain to be applied to successive samplings of an analog signal so as to raise the amplitude of each sampled signal to a desired level. The analog signal is sampled at predetermined time intervals and the voltage level of each of the sampled signals is identified. The gain to be applied to each of the sampled signals is selected in response to the identified voltage level of each of the sampled signals. The lower voltage level sampled signals are amplified to a greater extent than the higher voltage level sampled signals.

In a more specific aspect, the sampled signals are sequentially applied to an amplifying means having a plurality of selectable gain settings. A switching means selects the gain setting for the amplifying means in response to the voltage level of the particular sampled signal being concurrently applied to the amplifying means. The amplifying means includes a plurality of individual amplifiers, one such amplifier corresponding to each of the plurality of selectable gain settings. An electronic switch selects the output of the individual amplifier which has the desired gain for the particular voltage level of the sampled signal being concurrently applied to the amplifying means.

BRIEF DESCRIPTION OF THE DRAWINGS

FIGS. 1 and 2 are block diagrams of a borehole data acquisition unit employing the amplifying method and system of the present invention.

FIG. 4 is a block diagram of an uphole recording system for use with the borehole data acquisition unit of FIGS. 1 and 2.

FIG. 6 illustrates a look-up table for use with the borehole data acquisition units of FIGS. 1 and 2.

DESCRIPTION OF THE PREFERRED EMBODIMENT

The present invention relates to a new and improved method and system for amplifying analog signals and selecting the gain for such amplification so as to raise the amplitude of successive samplings of such analog signal to a desired level.

In the borehole logging system described in the aforementioned U.S. patent to Zemanek, Jr., analog signals from borehole receivers have typically been multiplexed, amplified, filtered, and transmitted over several miles of logging cable in analog form. State-of-the-art logging cables have relatively poor transmission qualities. Consequently, analog data transmission has reached the upper limit of data quality and dynamic range. Further, analog signals must be transmitted in real time. Simultaneous transmission of many channels of analog information requires multiconductor logging cables that are well shielded against crossfeed effects. Use of the present invention in such a borehole logging system will help overcome analog transmission difficulties by permitting the receiver signals to be amplified, digitized, transmitted over the several miles of variable quality logging cable and recovered with full fidelity at the surface of the earth. Also signals from several receivers can be amplified and digitally stored in solid state memories and transmitted over a single conductor at optimum intervals to minimize logging runs through the borehole.

Figures 1, 4:
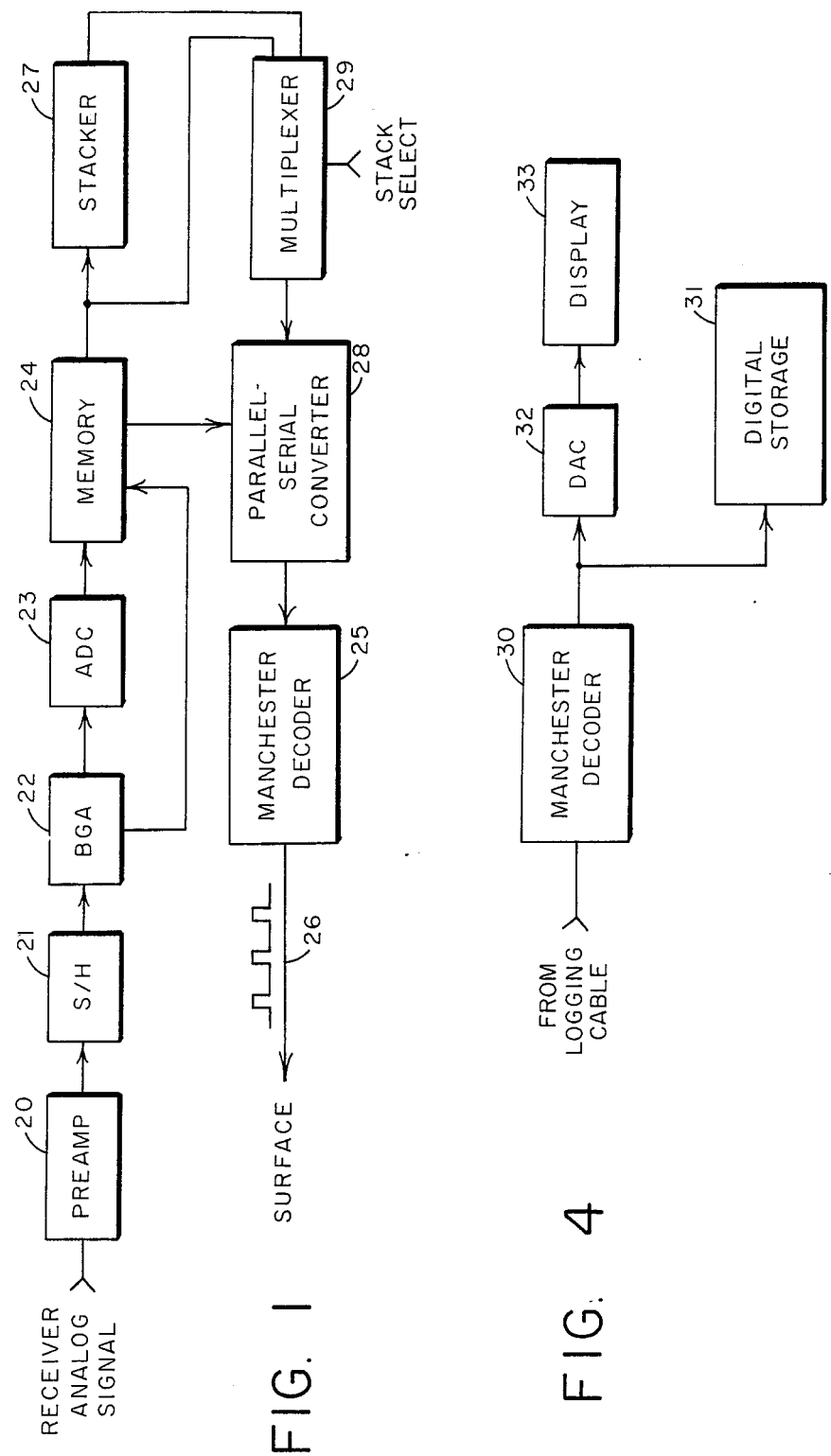

Referring now to FIG. 1, there is disclosed a data acquisition unit of a borehole logging system employing a binary gain selection technique in accordance with the present invention. Briefly, an analog voltage from a receiver in the borehole logging tool is applied to a pre-amp 20 and a sample and hold circuit 21. It is desirable to sample the analog receiver signal at a very high rate preferably in excess of 100 kilocycles. In one embodiment, the cycling rate has been selected as 200 kilocycles, or every 5 microseconds. A binary gain amplifier 22 acts to select and apply a desired gain for each sampled receiver signal. An analog-to-digital converter 23 converts the amplified analog signals to a digital data word which is stored in the solid state memory 24. A select number of the stored digital data words may be stacked at 27 to improve signal-to-noise ratio. Transmission of the stacked digital data words is by way of a parallel-to-serial converter 28 and a Manchester encoder 25 which operate to format and convert the digital data words into a digital serial word for telemetry to the surface of the earth over a single conductor 26 of the borehole logging cable.

More particularly, the binary gain amplifier 22 is programmable up to a gain of 128 through the 8 stages of gain as shown in FIG. 2. The purpose of such a gain range is to amplify low level receiver signals to a greater extent than the higher level receiver signals so that the analog-to-digital (A/D) converter 23 will always be operating on the highest level signal possible. For example, a very low level receiver signal can receive up to 42 db of gain while a high level signal can be passed on through the amplifier 22 with no gain. Such an amplitude equalization permits the A/D converter 23 to provide optimum analog-to-digital conversion of all receiver analog signals.

In one embodiment, A/D converter 23 provides an 8-bit digital data word for each sampling of the analog signal by the sample and hold circuit 21. To identify the gain applied to such analog signal, the amplifier 22 provides an additional 3-bit digital data word to the memory unit 24. The memory 24 combines these 3-bit and 8-bit digital data words to store an 11-bit digital data word of the sampled and amplified analog signal. The A/D converter 23 provides a dynamic range of 48 db. The total dynamic gain range provided by the combination of the amplifier 22 and A/D converter 23 is 90 db.

In such embodiment, the memory 24 has a storage capability of up to 2048 samples of digital data words of 11 bits each. The data acquisition time to complete the memory is 2048 samples times 5 microseconds per sample, or 10.24 milliseconds. When the memory is filled, the Manchester encoder 25 converts the 2048 digital data words into serial format for telemetry to the surface of the earth at a data rate of 150 kilobits per second or over a time period of 200 milliseconds. This can best be seen by reference to the timing diagram of FIG. 3.

In a further embodiment, the OR gate 29 permits the signal-to-noise ratio of the telemetered digital data to be enhanced by stacking a select number of digital data words from each sampling, for example, 2 to 8 of the 11 bit digital data words stored in memory 24 may be applied to a stacker 27 prior to encoding for telemetry by the Manchester encoder 25.

Referring now to FIG. 4, there is shown uphole circuitry for receiving and recording the digital serial data words as telemetered over the several miles of logging cable 26. Uphole reception is by way of a Manchester decoder 30 which converts the serial stream of digital data back into individual 11 bit digital data words for either storage on a digital storage device 31, such as a digital tape transport, or for conversion back into analog format by the digital-to-analog converter 32 for viewing on a suitable display device 33.

Figures 3, 5:
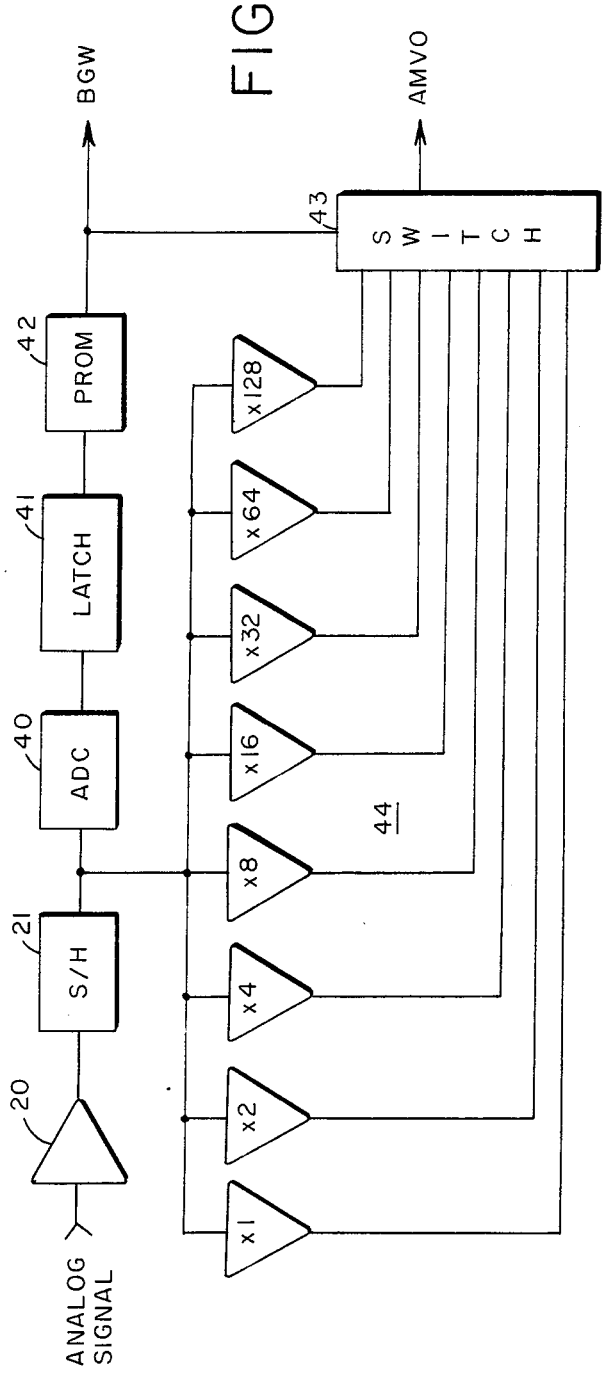
FIG. 3 is a timing diagram useful in understanding the operation of FIGS. 1 and 2.
FIG. 5 is an electrical schematic of a portion of the block diagrams of FIGS. 1 and 2.

Referring now to FIG. 5, there will be described in more detail the operation of the binary gain amplifier 22. The analog receiver signal, after passing through the preamplifier, 20 is applied to the sample and hold 21. The analog signal is sampled for about 500 nanoseconds, for example, and then the sampled voltage is held constant for about 4.5 microseconds, for example. It is during this holding period that the analog-to-digital conversion takes place within the A/D converter 40. The sampled voltage is converted to an 8 bit digital data word by A/D converter 40 and applied by way of the latch 41 to the memory 42 which is a programmable read only memory. The memory 42 is programmed in accordance with a lock-up table such as the one shown in FIG. 6 to select a desired dynamic gain based upon the voltage level of the sampled analog receiver signal.

For example, a high level signal of +5.12 volts to +10.24 volts would require no gain or an amplification of ×1. As the signal level decreases, the desired gain increases in 6 db steps with an amplification of ×1 to amplifications ×2, ×4, ×8, ×16, ×32, ×64 and ×128. Likewise, the same gain selection process is carried out for negative voltage levels.

The output of the memory 42 is a 3 bit binary gain word representing the particular gain selection. This binary gain word is applied to the analog switch 43 which selects the particular amplifier in the bank of amplifiers 44 which gives the selected amount of $2^N$ amplification, N being the desired integer for the amplifications of ×1, ×2, ×4, ×8, ×16, ×32, ×64 and ×128. For example, an analog voltage of +2.0 volts might be stored in the sample and hold 21. This voltage is applied to the input of each of the amplifiers of amplifier bank 44. Only the output of the ×4 amplifier is selected by the switch 43 in response to the programmed gain selection carried out by the memory 42. The ×4 analog modified voltage output signal (AMVO) is then passed on by switch 43 to the A/D converter 23 for digitization while the 3 bit binary gain word (BGW) from the memory 42 is passed on to the memory 24 for inclusion in the 11 bit digital data word generated therein.

It is to be understood that the foregoing described circuit elements are merely representative of one embodiment of the present invention. Various other types and values of circuit components may be utilized. In accordance with the preferred embodiment, the following table sets forth specific types and values of the circuit elements.

TABLE

| Reference Designation | Description |
|---|---|
| Serial-to-parallel converter 28 | 74 LS165 |
| Manchester encoder 25 | HD15530 (Harris) |
| Memory 24 | 8108 (16 × 2K) |
| Preamp 20 | OP27 (Precision Monolithic Incorporated) |
| Sample and Hold 21 | MN346 T/H (Micro Networks) |
| Analog-to-digital converters 23 & 40 | MN 5132 (Micro Networks) |
| Manchester decoder 30 | HD 15530 (Harris) |
| Digital-to-analog converter 32 | MN 3020 (Micro Networks) |
| Latch 41 | 74 LS 374 (Texas Instruments) |
| Memory 42 | HM-7611 (Harris) |
| Switch 43 | HI-1818 CMOS (Harris) |
| Amplifier 44 | OP 27 (Precision Monolithic Incorporated) |

I claim:
1. A method for selecting the gain to be applied to successive samplings of an analog signal voltage so as to raise the amplitude of such sampled signal voltage to a desired level, comprising the steps of:
(a) sampling said analog signal voltage, over a plurality of first time intervals,
(b) holding said samplings of said analog voltage constant over a plurality of second time intervals,
(c) converting said samplings of said analog voltage to digital data words during said second time intervals, and
(d) applying said digital data words to a programmable read only memory which is programmed with a preprogrammed look-up table to select a dynamic gain which will raise the voltage level of said samplings of said analog voltage as represented by said digital data words to achieve amplitude equalization for each of said samplings of said analog signal.

2. The method of claim 1 wherein said first time period is on the order of 500 nano-seconds interval.

3. The method of claim 1 wherein said second time period is on the order of 4.5 microseconds interval.

4. A programmable gain amplifier system comprising:
   (a) means for sampling the sweep of an analog signal over a plurality of first time intervals, each interval being in the order of 500 nanoseconds,
   (b) means for holding each of said plurality of analog signal samplings constant over a plurality of second time periods, each period being in the order of 450 microseconds,
   (c) an analog to digital converter for converting said analog signal samplings to digital words during said second time periods,
   (d) a programmable read only memory which compares said digital words with a preprogrammed look-up table to identify the dynamic gain which will raise the voltage level of the lower level analog signal samplings to a greater extent than the higher level analog signal samplings, thereby effecting amplitude equalization over the entire sweep of the analog signal,
   (e) an amplifying means to which said analog signal samplings are applied during said plurality of second time periods and having a plurality of selectable gain settings, and
   (f) means for selecting the gain setting of said amplifying means which corresponds to the desired dynamic gain identified by said programmable read only memory.

* * * * *